(12) United States Patent
Ohashi et al.

(10) Patent No.: US 11,501,163 B2
(45) Date of Patent: Nov. 15, 2022

(54) ABNORMALITY DETECTION DEVICE, ABNORMALITY DETECTION METHOD, AND STORAGE MEDIUM

(71) Applicants: Kabushiki Kaisha Toshiba, Minato-ku (JP); Toshiba Digital Solutions Corporation, Kawasaki (JP)

(72) Inventors: Jun Ohashi, Ota (JP); Yumi Ozaki, Kawasaki (JP)

(73) Assignees: Kabushiki Kaisha Toshiba, Tokyo (JP); Toshiba Digital Solutions Corporation, Kawasaki (JP)

( * ) Notice: Subject to any disclaimer, the term of this patent is extended or adjusted under 35 U.S.C. 154(b) by 796 days.

(21) Appl. No.: 16/476,449

(22) PCT Filed: Sep. 25, 2017

(86) PCT No.: PCT/JP2017/034599
§ 371 (c)(1),
(2) Date: Jul. 8, 2019

(87) PCT Pub. No.: WO2018/131219
PCT Pub. Date: Jul. 19, 2018

(65) Prior Publication Data
US 2020/0057939 A1 Feb. 20, 2020

(30) Foreign Application Priority Data
Jan. 11, 2017 (JP) .................................. 2017-002521

(51) Int. Cl.
*G06N 3/08* (2006.01)
*G06F 11/22* (2006.01)
(Continued)

(52) U.S. Cl.
CPC ............ *G06N 3/08* (2013.01); *G06F 11/2257* (2013.01); *G06N 3/0454* (2013.01); *H03M 7/30* (2013.01)

(58) Field of Classification Search
CPC ........ G06N 3/08; G06N 3/0454; G06N 3/084; G06N 3/088; G06F 11/2257; H03M 7/30; H03M 7/6041
See application file for complete search history.

(56) References Cited

U.S. PATENT DOCUMENTS 10,602,940 B1 * 3/2020 Muchhala ............... G16H 50/70
10,816,951 B2 * 10/2020 Abe ...................... G05B 19/058
(Continued)

FOREIGN PATENT DOCUMENTS

JP 2016-4549 A 1/2016

OTHER PUBLICATIONS

International Search Report dated Dec. 19, 2017 in PCT/JP2017/034599 filed on Sep. 25, 2017.

*Primary Examiner* — Jean B JeanGlaude
(74) *Attorney, Agent, or Firm* — Maier & Maier, PLLC (57) ABSTRACT

An abnormality detection device according to an embodiment includes a detector, a remover, and a learner. The detector detects first abnormal data in detection target data which is an abnormality detection target by inputting the detection target data to a first autoencoder which performed learning based on first learning target data which is a learning target. The remover removes data associated with the first abnormal data from the first learning target data to generate second learning target data by inputting the first learning target data to a second autoencoder which performed learning based on the first abnormal data detected by (Continued)

the detector. The learner causes the first autoencoder to perform learning based on the second learning target data generated by the remover.

9 Claims, 10 Drawing Sheets

(51) Int. Cl.
  *G06N 3/04* (2006.01)
  *H03M 7/30* (2006.01)

(56) References Cited

U.S. PATENT DOCUMENTS 10,925,502 B2 * 2/2021 Muchhala .......... A61B 5/02405
2018/0239345 A1 * 8/2018 Noda .................... G05B 23/024
2018/0333063 A1 * 11/2018 Muchhala .............. A61B 5/243

* cited by examiner

| DATA SET | CONTENT | NUMBER OF PIECES OF DATA |
|---|---|---|
| FIRST LEARNING TARGET DATA | NORMAL DATA 90%, ABNORMAL DATA 10% | 62,500 |
| DETECTION TARGET DATA | NORMAL DATA 50%, ABNORMAL DATA 50% | 62,500 |
| TEST DATA | NORMAL DATA 50%, ABNORMAL DATA 50% | 10,000 |
| FIRST ABNORMAL DATA | DATA IN WHICH DECOMPRESSION ERROR IS WITHIN 10000 IN DESCENDING ORDER BY INPUTTING DETECTION TARGET DATA TO FIRST AUTOENCODER 30 | 10,000 |
| SECOND LEARNING TARGET DATA | DATA FROM WHICH DATA OF WHICH DECOMPRESSION ERROR IS WITHIN 6000 IN ASCENDING ORDER BY INPUTTING FIRST LEARNING TARGET DATA TO SECOND AUTOENCODER 32 IS REMOVED | 56,500 |

FIG. 12

ABNORMALITY DETECTION DEVICE, ABNORMALITY DETECTION METHOD, AND STORAGE MEDIUM

TECHNICAL FIELD

Embodiments of the present invention relate to an abnormality detection device, an abnormality detection method, and a storage medium.

BACKGROUND ART

In recent years, abnormality detection methods of data using autoencoders have been known. In such abnormality detection methods, detection of abnormal data is performed using a model that compresses and decompresses data with as little loss as possible using relevance or a pattern between pieces of normal data. When normal data is processed using the model, loss of the data becomes slight, that is, a difference between original data before compression and data after decompression (hereinafter referred to as a "decompression error") becomes slight. On the other hand, when abnormal data is processed, loss of the data is significant, that is, a decompression error is significant. In the abnormality detection methods, abnormality of data is detected based on the magnitude of the decompression error.

Since the foregoing abnormality detection methods are unsupervised learning, there is the advantage that data can be used without work of labeling abnormality or normality, and thus the abnormality detection methods are widely used for failure detection of various devices, unauthorized access detection of a network, and the like.

In the foregoing abnormality detection methods, it is necessary to perform a learning process using learning data in advance in order to generate a model. However, the learning data includes abnormal data in addition to normal data in some cases. When the learning process is performed using the learning data including abnormal data, precision of abnormality detection deteriorates in some cases.

CITATION LIST

Patent Literature

Patent Literature 1

Japanese Unexamined Patent Application, First Publication No. 2016-4549

SUMMARY OF INVENTION

Technical Problem

The technical problem which the invention solves is to provide an abnormality detection device, an abnormality detection method, and a storage medium capable of performing abnormality detection for data with high precision.

Solution to Problem

An abnormality detection device according to an embodiment includes a detector, a remover, and a learner. The detector detects first abnormal data in detection target data which is an abnormality detection target by inputting the detection target data to a first autoencoder which performed learning based on first learning target data which is a learning target. The remover removes data associated with the first abnormal data from the first learning target data to generate second learning target data by inputting the first learning target data to a second autoencoder which performed learning based on the first abnormal data detected by the detector. The learner causes the first autoencoder to perform learning based on the second learning target data generated by the remover.

DESCRIPTION OF EMBODIMENTS

An abnormality detection device, an abnormality detection method, and a storage medium according to embodiments will be described with reference to the drawings.

First Embodiment

The abnormality detection device according to the embodiment removes abnormal data included in data which is a learning target used at the time of learning (hereinafter referred to as "learning target data") using abnormal data detected when abnormality detection is performed (operated) using an autoencoder. Then, by causing the autoencoder to perform learning using learning target data from which the abnormal data is removed, it is possible to improve performance of the abnormality detection.

Figure 1:
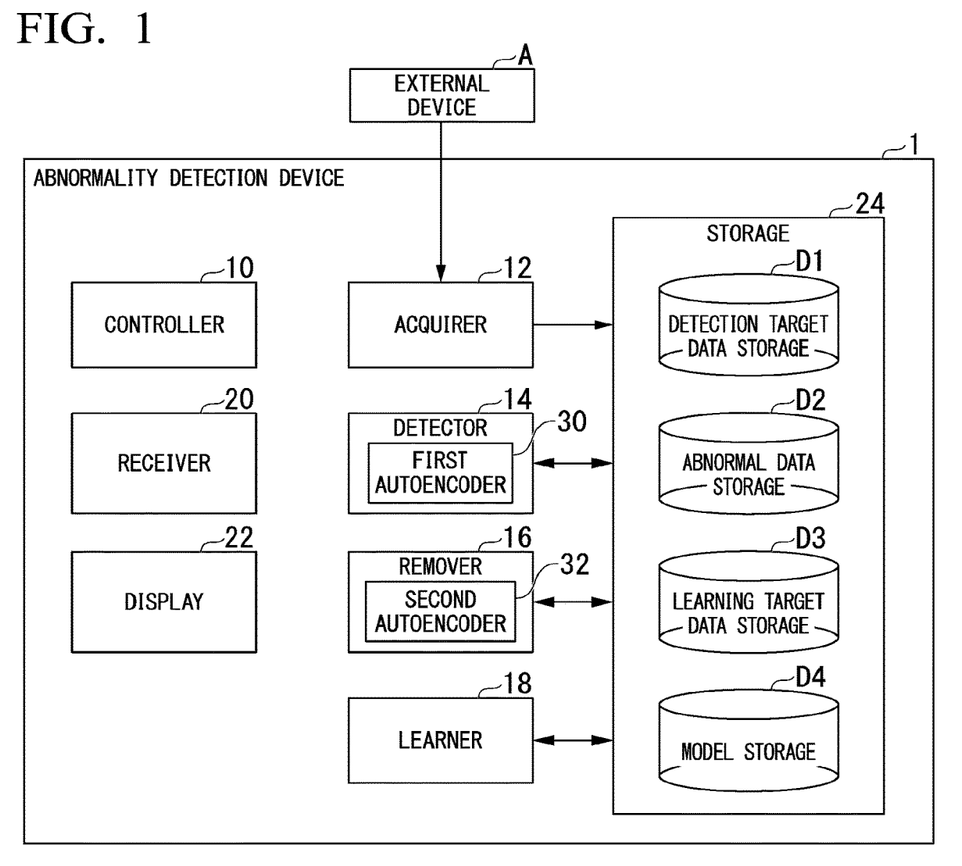
FIG. 1 is a functional block diagram showing an example of an abnormality detection device according to a first embodiment.

FIG. 1 is a functional block diagram showing an example of an abnormality detection device 1 according to the first embodiment. The abnormality detection device 1 performs abnormality detection of data which is an abnormality detection target (hereinafter referred to as "detection target data"). The abnormality detection according to the embodiment indicates that data (abnormal data) with a different tendency from most data (normal data) among detection target data is found. The abnormality detection device 1 ascertains relevance or a pattern between pieces of data in normal data by performing a compression and decompression process (decoding process) for the normal data as preliminary preparation for performing abnormality detection, and learns a procedure for performing the compression and decoding process in which a decompression error is slight. For example, the abnormality detection device 1 performs the compression and decompression process for the learning target data prepared for learning to generate a model suitable for the learning target data (a normal model).

The abnormality detection device 1 performs the compression and decompression process in which a decompression error is slight on normal data included in the detection target data. When the compression and decompression process is performed on abnormal data, the decompression error increases. The abnormality detection device 1 can detect abnormal data based on the magnitude of the decompression error.

The abnormality detection device 1 acquires detection target data from, for example, an external device A which is any of various sensors. The detection target data includes, for example, any data such as sensor data measured by various sensors, operation log data of various devices, and various numerical value data.

The abnormality detection device 1 includes, for example, a controller 10, an acquirer 12, a detector 14, a remover 16, a learner 18, a receiver 20, a display 22, and a storage 24. The storage 24 includes, for example, a detection target data storage D1, an abnormal data storage D2, a learning target data storage D3, and a model storage D4. The controller 10 performs control on an operation of each unit of the abnormality detection device 1.

The acquirer 12 acquires the detection target data from the external device A and causes the detection target data storage D1 to store the detection target data. For example, the acquirer 12 continues to acquire the detection target data from the external device A. Alternatively, the acquirer 12 may acquire the detection target data accumulated in the external device A at a predetermined period. When the receiver 20 receives a data acquisition instruction from a user of the abnormality detection device 1, the acquirer 12 may acquire the detection target data from the external device A.

The detector 14 reads the detection target data from the detection target data storage D1 and performs abnormality detection. The detector 14 includes, for example, a first autoencoder 30 that performed learning using the learning target data. The first autoencoder 30 performs the compression and decompression process for the detection target data using a normal model stored in the model storage D4 and generates decompressed data. The normal model is a model suitable for normal data calculated through the learning performed using the learning target data. When the normal data is processed, the first autoencoder 30 performs the compression and decompression process in which a decompression error is slight. On the other hand, when the abnormal data is processed, the first autoencoder 30 performs the compression and decompression process in which a decompression error is significant. The detector 14 performs the abnormality detection on the data based on the magnitude of the decompression error.

For example, the detector 14 calculates a decompression error (a first difference) in the detection target data, determines that the data is abnormal data when the calculated decompression error is equal to or greater than a predetermined threshold, and determines that the data is normal data when the calculated decompression error is less than the threshold. The threshold is defined in advance using a mean square error or the like. For example, the threshold may be set to α (where α is a positive number) times the mean square error of the normal data. The detector 14 causes the abnormal data storage D2 to store the detected abnormal data.

The remover 16 reads the learning target data from the learning target data storage D3 and removes the abnormal data included in the learning target data. The remover 16 includes, for example, a second autoencoder 32 that performed learning using the abnormal data. The second autoencoder 32 performs a compression and decompression process for the detection target data using an abnormal model stored in the model storage D4 and generates decompressed data. The abnormal model is a model suitable for abnormal data calculated through the learning performed using the abnormal data. That is, the remover 16 deletes data associated with the abnormal data detected by the detector 14 from the learning target data. The remover 16 deletes the abnormal data with the same property (tendency) as the abnormal data detected by the detector 14 from the learning target data.

For example, the remover 16 calculates a decompression error (a second difference) of the learning target data, determines that the data is abnormal data when the calculated decompression error is equal to or greater than a predetermined threshold, and determines that the data is normal data when the calculated decompression error is less than the threshold. The data determined to be the abnormal data by the remover 16 is data which is determined to be normal data in the abnormality detection performed by the detector 14. The data determined to be the normal data by the remover 16 is data which is determined to be abnormal data in the abnormality detection performed by the detector 14.

The remover 16 generates new learning target data in which a ratio of the abnormal data is reduced by removing the data (data which is determined to be abnormal data by the detector 14) determined to be normal data by the remover 16 from the learning target data. That is, the remover 16 extracts the data (data which is determined to be normal data by the detector 14) determined to be the abnormal data by the remover 16 from the learning target data. The remover 16 causes the learning target data storage D3 to store the new learning target data.

The learner 18 controls learning processes by the first autoencoder 30 and the second autoencoder 32. For example, the learner 18 causes the first autoencoder 30 to perform learning based on the learning target data. For example, the learner 18 causes the second autoencoder 32 to perform learning based on abnormal data obtained by inputting the detection target data to the first autoencoder 30.

The receiver 20 receives an operation by the user of the abnormality detection device 1. The receiver 20 is, for example, an input terminal such as a mouse, a keyboard, or a touch panel.

The display 22 displays, for example, a result of the abnormality detection or the like by the detector 14. For example, the display 22 is a liquid crystal display or the like. When the display 22 is a display corresponding to a touch panel, the display 22 may have the function of the foregoing receiver 20.

Some or all of the functional units of the foregoing abnormality detection device 1 may be realized when a processor executes a program (software). In this case, the abnormality detection device 1 may be realized by installing the foregoing program in advance in a computer device. Alternatively, the foregoing program stored in a storage medium such as a CD-ROM or the foregoing program distributed via a network may be installed appropriately in a computer device for realizing the abnormality detection device 1. Some or all of the functional units of the abnormality detection device 1 may be realized by hardware such as a large scale integration (LSI), an application specific integrated circuit (ASIC), or a field-programmable gate array (FPGA) or may be realized by combining software and hardware.

The storage 24 stores detection target data and various kinds of internal data, various models, and the like processed internally in the abnormality detection device 1. The storage 24 is realized with a read-only memory (ROM), a random access memory (RAM), a hard disk drive (HDD), a flash memory, or the like. The detection target data storage D1 stores detection target data acquired from the external device A by the acquirer 12. The abnormal data storage D2 stores abnormal data determined to be abnormal by the detector 14. The learning target data storage D3 stores learning target data used in a learning process of the first autoencoder 30. The model storage D4 stores various models to be used in the abnormality detection process by the detector 14 and the removing process by the remover 16.

Figure 2:
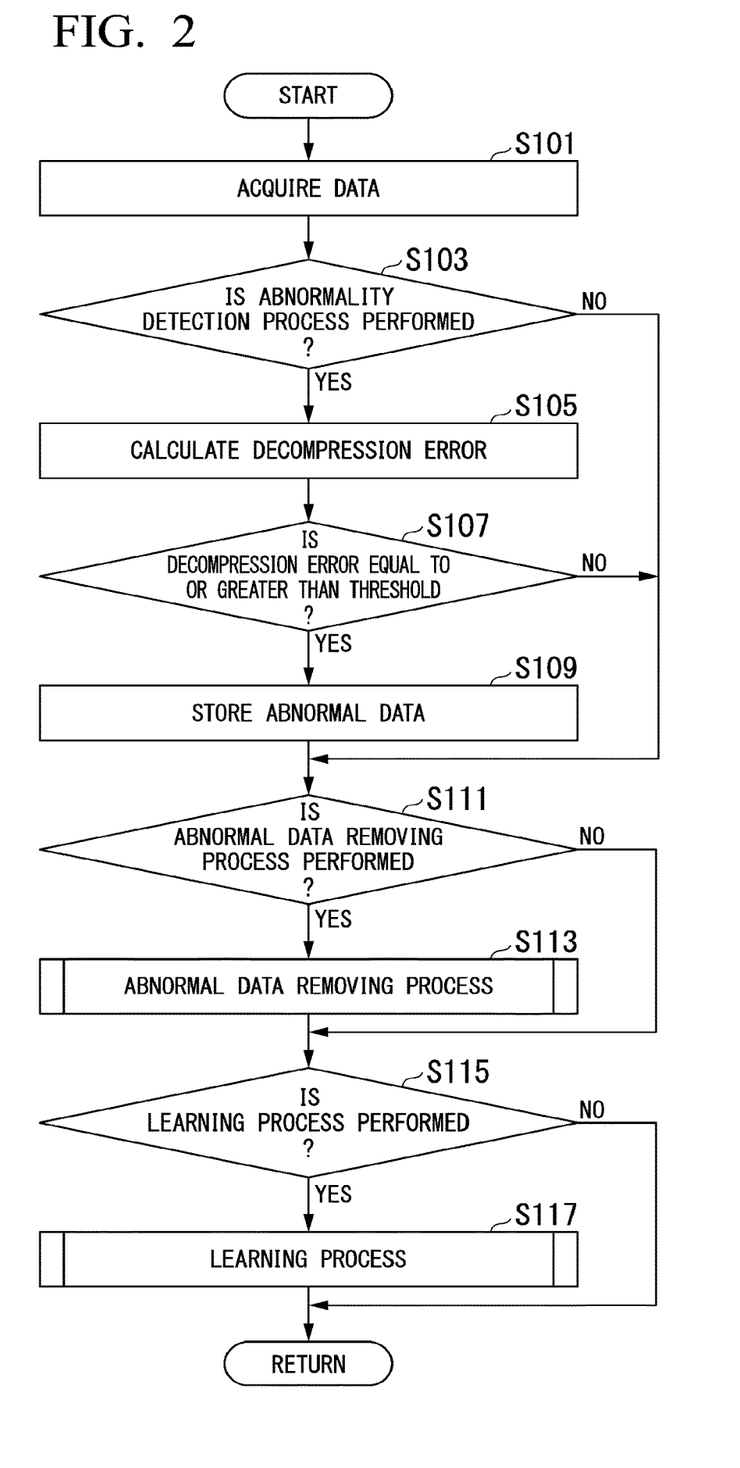
FIG. 2 is a flowchart showing an example of a process by the abnormality detection device according to the first embodiment.

Next, an operation of the abnormality detection device 1 according to the embodiment will be described. FIG. 2 is a flowchart showing an example of a process by the abnormality detection device 1 according to the embodiment.

First, the acquirer 12 acquires detection target data from the external device A and causes the detection target data storage D1 to store the detection target data under the control of the controller 10 (step S101). For example, the acquirer 12 continues to acquire detection target data from the external device A. Alternatively, the acquirer 12 may acquire the detection target data accumulated in the external device A at a predetermined period.

Next, the controller 10 determines whether the abnormality detection process is performed on the detection target data acquired from the external device A (step S103). For example, when the receiver 20 receives an instruction to perform the abnormality detection process from the user of the abnormality detection device 1, the controller 10 determines that the abnormality detection process is performed. Alternatively, the controller 10 may determine that the abnormality detection process is performed when a predetermined time has passed. Without determining whether the abnormality detection process is performed, the controller 10 may necessarily perform the abnormality detection process when detection target data is acquired from the external device A.

When the controller 10 determines that the abnormality detection process is performed on the detection target data, the detector 14 reads the detection target data from the detection target data storage D1, compresses and decompresses the detection target data using the first autoencoder 30 performing learning based on the learning target data (first learning target data), and calculates a decompression error (step S105).

Next, the detector 14 determines whether the calculated decompression error is equal to or greater than a threshold (step S107). The threshold is defined in advance using a mean square error or the like of normal data.

When the detector 14 determines that the decompression error calculated is equal to or greater than the threshold, that is, the detector 14 determines that the detection target data is determined to be abnormal data, the detector 14 causes the abnormal data storage D2 to store the detection target data as abnormal data (step S109). Conversely, when the detector 14 determines that the decompression error calculated is less than the threshold, that is, the detector 14 determines that the detection target data is normal data, the detector 14 does not cause the abnormal data storage D2 to store the detection target data. When the number of pieces of detection target data is plural, the abnormality detection and storage processes based on the decompression error are performed on each piece of the detection target data. The controller 10 may cause the display 22 to display information regarding the abnormal data detected by the detector 14.

Next (or when the controller 10 determines that the abnormality detection is not performed on the detection target data), the controller 10 determines whether the abnormal data removing process is performed (step S111). For example, when the receiver 20 receives an instruction to perform an abnormality data removing process by the user of the abnormality detection device 1, the controller 10 determines that the abnormality data removing process is performed. Alternatively, when a predetermined time has passed, the controller 10 may determine that the abnormal data removing process is performed. The controller 10 may necessarily perform the abnormal data removing process without determining whether the abnormal data removing process is performed.

When the controller 10 determines that the abnormal data removing process is performed, the remover 16 performs the abnormal data removing process (S113). The details of the abnormal data removing process will be described later.

Next (or when the controller 10 determines that the abnormal data removing process is not performed on the detection target data), the controller 10 determines whether the learning process is performed (step S115). For example, when the receiver 20 receives an instruction to perform a learning process from the user of the abnormality detection device 1, the controller 10 determines that the learning process is performed. Alternatively, when a predetermined time has passed, the controller 10 may determine that the learning process is performed. The controller 10 may necessarily perform the learning process without determining whether the learning process is performed. When the controller 10 determines that the learning process is not performed, the process of acquiring the detection target data is performed again.

When the controller 10 determines that the learning process is performed, the learner 18 performs the learning process (S117). The details of the learning process will be described later. Subsequently, the process of acquiring the detection target data is performed again.

Figure 3:
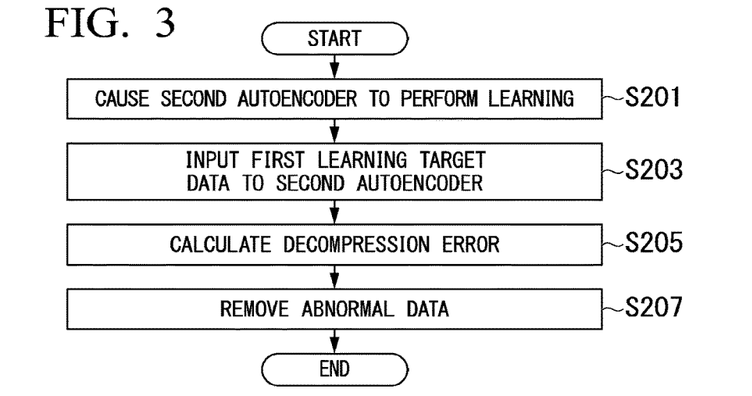
FIG. 3 is a flowchart showing an example of an abnormal data removing process by the abnormality detection device according to the first embodiment.
Figure 4:
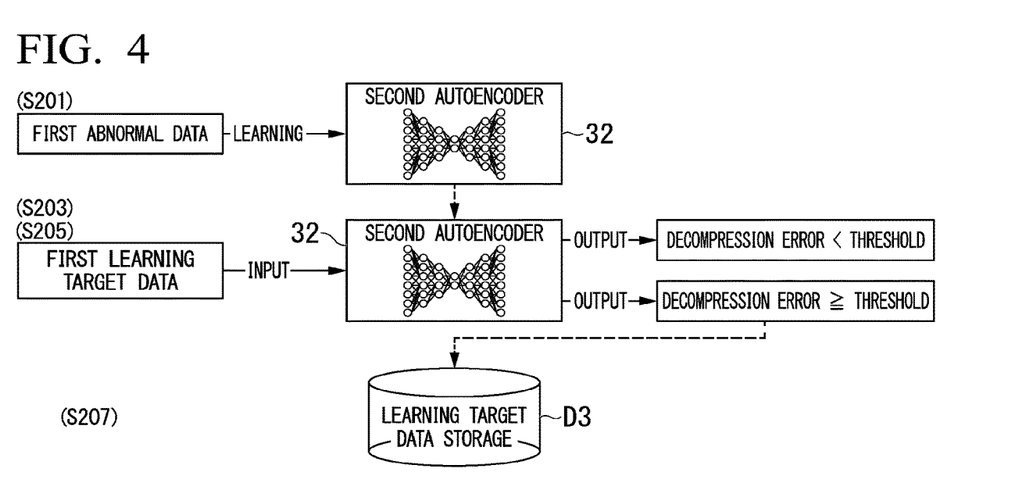
FIG. 4 is a diagram showing the abnormal data removing process by the abnormality detection device according to the first embodiment.

Next, an abnormality data removing process by the abnormality detection device 1 according to the embodiment will be described. FIG. 3 is a flowchart showing an example of the abnormal data removing process by the abnormality detection device 1 according to the embodiment. FIG. 4 is a diagram showing the abnormal data removing process by the abnormality detection device 1 according to the embodiment.

First, the learner 18 reads the abnormal data from the abnormal data storage D2 and causes the second autoencoder 32 to perform learning based on the abnormal data (step S201).

Next, the remover 16 reads the first learning target data from the learning target data storage D3 and inputs the first learning target data to the second autoencoder 32 which performed the learning based on the abnormal data (step S203). The second autoencoder 32 compresses and decompresses the first learning target data to generate decompressed data.

Next, the remover 16 calculates the decompression error using the first learning target data and the decompressed data (step S205). When there are a plurality of pieces of data in the first learning target data, a decompression error is calculated for each piece of data.

Next, the remover 16 removes the abnormal data from the first learning target data (step S207). For example, the remover 16 generates learning target data from which the abnormal data is removed (second learning target data) by causing the learning target data storage D3 to store the data of which the decompression error is equal to or greater than the threshold. The remover 16 deletes the data associated with the abnormal data detected by the detector 14 from the first learning target data. With this, the process of the flowchart ends.

Figure 5:
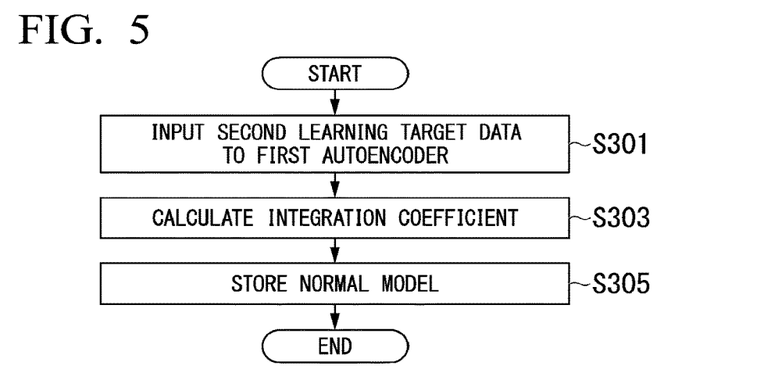
FIG. 5 is a flowchart showing an example of a learning process by the abnormality detection device according to the first embodiment.

Next, a learning process of the abnormality detection device 1 according to the embodiment will be described. FIG. 5 is a flowchart showing an example of the learning process by the abnormality detection device 1 according to the embodiment.

First, the learner 18 reads learning target data (the second learning target data from which the abnormal data is removed through the foregoing abnormal data removing process) from the learning target data storage D3 and inputs the second learning target data to the first autoencoder 30 (step S301).

Next, the learner 18 causes the first autoencoder 30 to perform learning and calculates an inter-node integration coefficient suitable for the second learning target data (step S303). The integration coefficient is calculated using, for example, a back propagation method (error back propagation method).

Next, the learner 18 causes the model storage D4 to store the calculated integration coefficient as a normal model (step S305). With this, the process of the flowchart ends.

According to the above-described embodiment, it is possible to provide the abnormality detection device, the abnormality detection method, and the storage medium capable of performing the abnormality detection with high precision. In the embodiment, the first autoencoder 30 performs the learning based on the learning target data from which the abnormal data is removed by the remover 16, thereby improving precision of the abnormality detection by the detector 14. The abnormality detection device 1 according to the embodiment can be used for failure or abnormality detection based on output data of various devices, inspection in a manufacturing line based on an image of a product, unauthorized access detection of a network, or the like.

Figure 6:
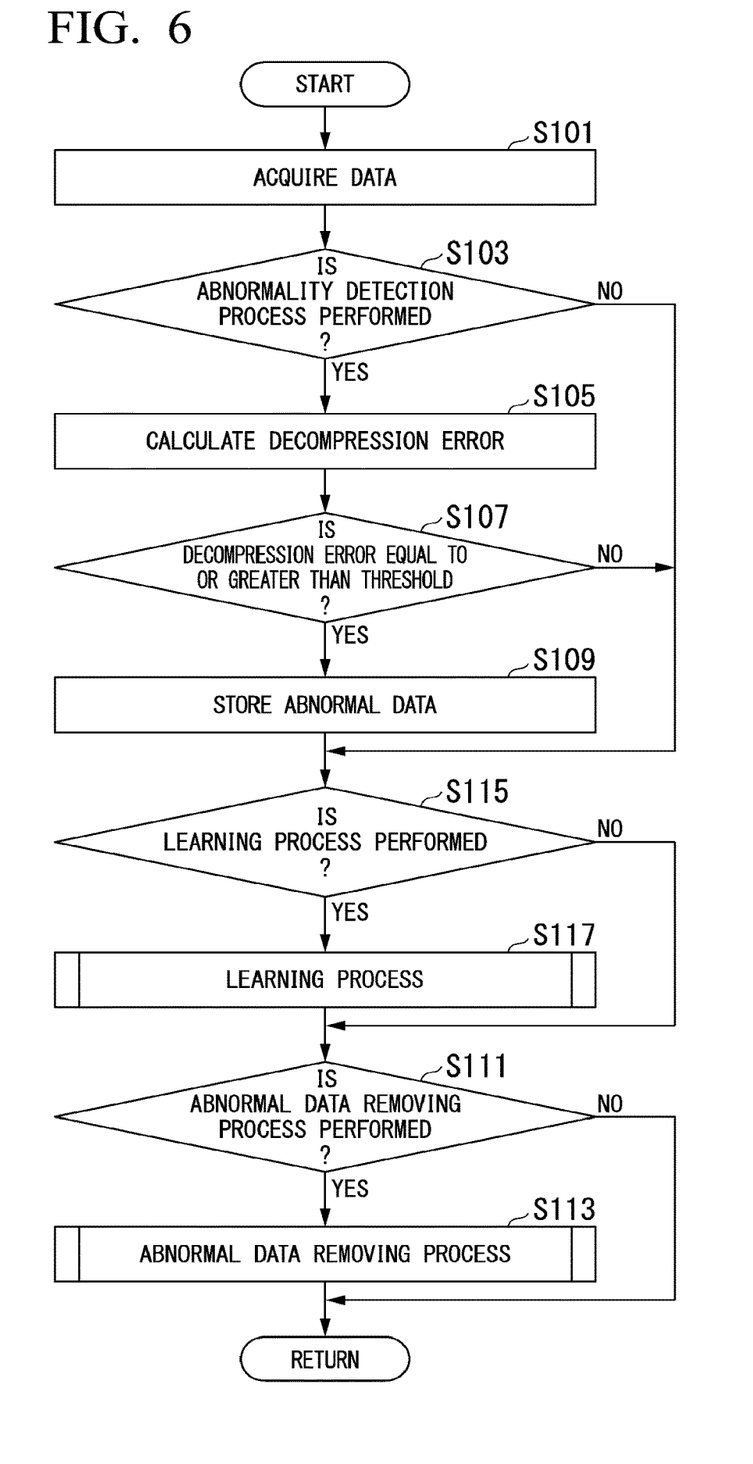
FIG. 6 is a flowchart showing another example of the process by the abnormality detection device according to the first embodiment.

In the embodiment, the example in which the "learning process (step S117)" is performed after the "abnormal data removing process (step S113)" is performed has been described. However, as shown in FIG. 6, the "abnormal data removing process (step S113)" may be performed after the "learning process (step S117)."

In the embodiment, the example in which the learning process of the second autoencoder 32 is performed at the beginning of the "abnormal data removing process (step S113)" has been described. However, the learning of the second autoencoder 32 may be performed in the "learning process (step S117)."

Second Embodiment

Next, a second embodiment will be described. Compared to the first embodiment, the abnormality detection device according to the embodiment is different in that an abnormal data removing process is performed using a plurality of autoencoders. Therefore, in the description of the embodiment, the same reference numerals are given to similar portions to the foregoing first embodiment and the description thereof will be omitted or simplified. Since the processes up to the second learning target data have been described in the first embodiment, the description thereof will be omitted.

In learning target data, there are a plurality of kinds of abnormal data with mutually different properties in some cases. By using a plurality of kinds of autoencoders suitable for the plurality of kinds of abnormal data, it is possible to improve performance for removing abnormal data.

Figure 7:
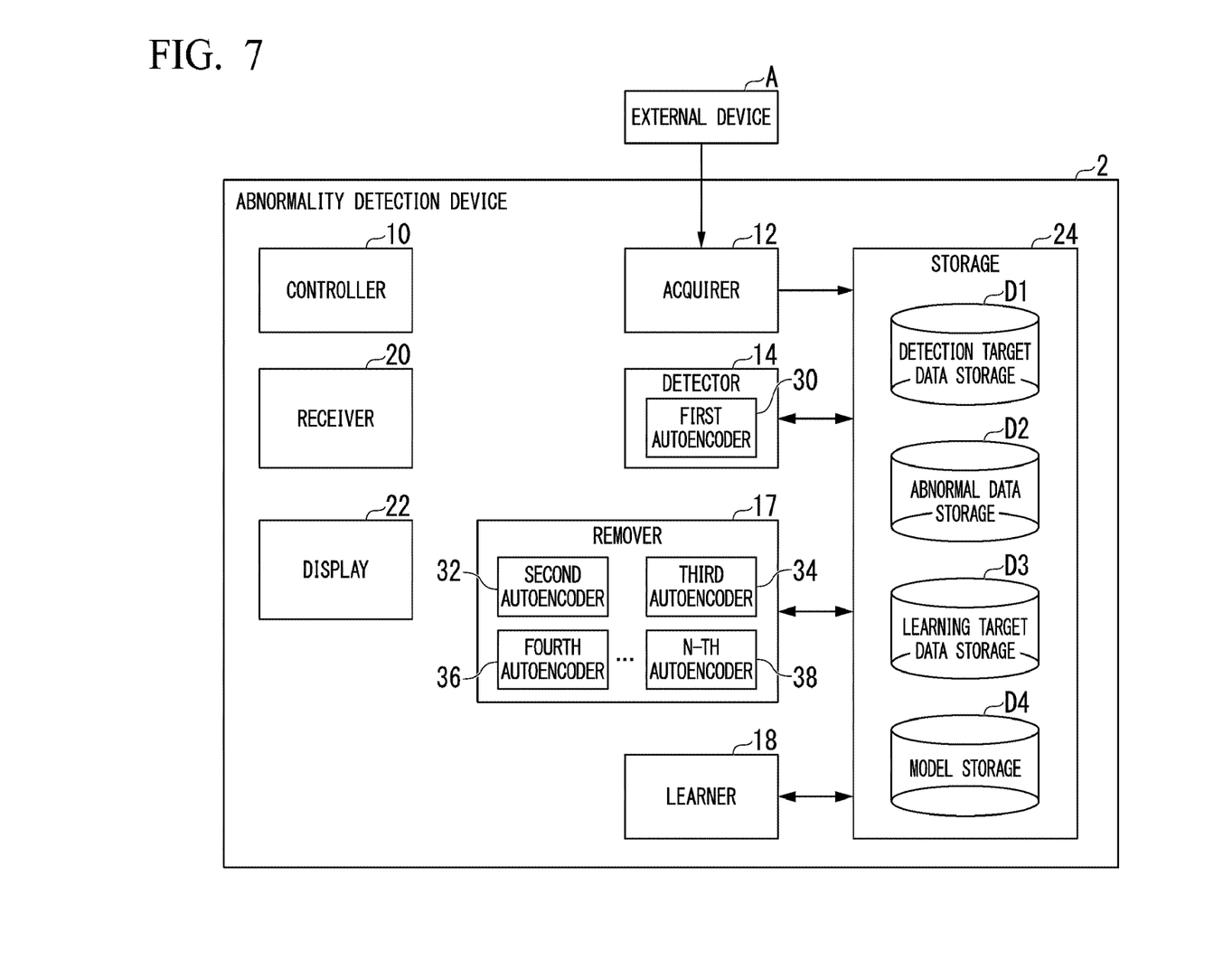
FIG. 7 is a functional block diagram showing an example of an abnormality detection device according to a second embodiment.

FIG. 7 is a functional block diagram showing an example of an abnormality detection device 2 according to the embodiment. Compared to the first embodiment, an abnormality detection device 2 according to the embodiment includes a remover 17 that performs abnormal data removing process using a plurality of autoencoders.

Figure 8:
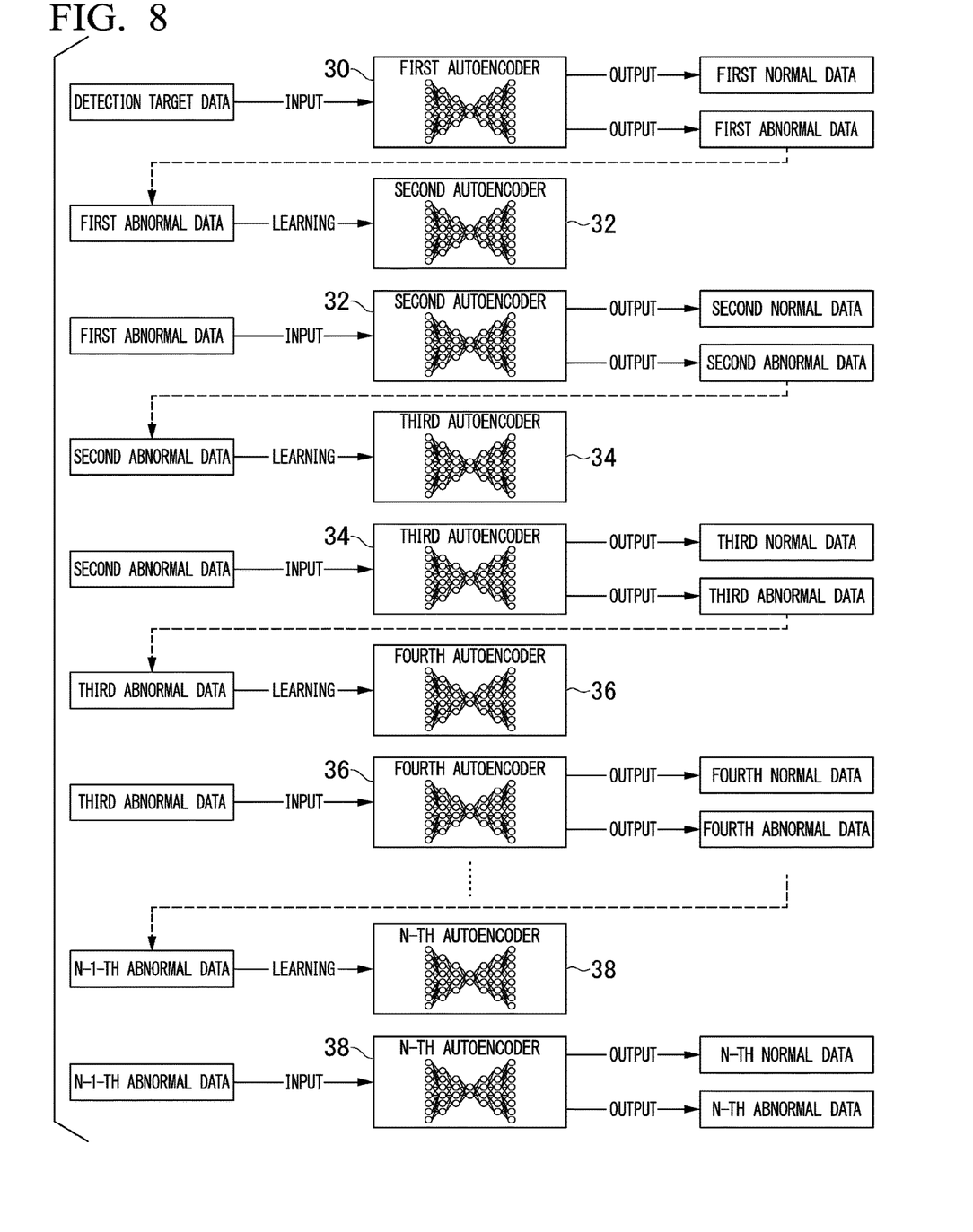
FIG. 8 is a diagram showing an example of a relation among autoencoders in the abnormality detection device according to the second embodiment.

The remover 17 includes, for example, N−1 autoencoders (second to N-th autoencoders). N is a natural number equal to or greater than 2. FIG. 8 is a diagram showing an example of a relation among the second to N-th autoencoders in the abnormality detection device 2 according to the embodiment. The second autoencoder 32 performs learning using first abnormal data obtained by inputting detection target data to the first autoencoder 30. A third autoencoder 34 performs learning using second abnormal data obtained by inputting the first abnormal data to the second autoencoder 32. A fourth autoencoder 36 performs learning using third abnormal data obtained by inputting the second abnormal data to the third autoencoder 34. An N-th autoencoder 38 performs learning using N−1-th abnormal data obtained by inputting N−2-th abnormal data to the N−1-th autoencoder.

That is, the remover 17 removes n-th abnormal data from the n-th learning target data to generate n+1-th learning target data by inputting n-th learning target data to an n+1-th autoencoder which performed learning based on the n-th abnormal data. The n-th abnormal data is data in which a difference between the n−1-th abnormal data and the decompressed data generated by compressing and decompressing the n−1-th abnormal data by the n-th autoencoder is equal to or greater than a threshold in the n−1-th abnormal data. The learner 18 causes the first autoencoder 30 to perform learning based on the n+1-th learning target data. N is a natural number equal to or greater than 2.

The model storage D4 stores second to N-th abnormal models used by the second to N-th autoencoders. For example, the second autoencoder 32 compresses and decompresses the detection target data using the second abnormal model stored in the model storage D4.

Figure 9:
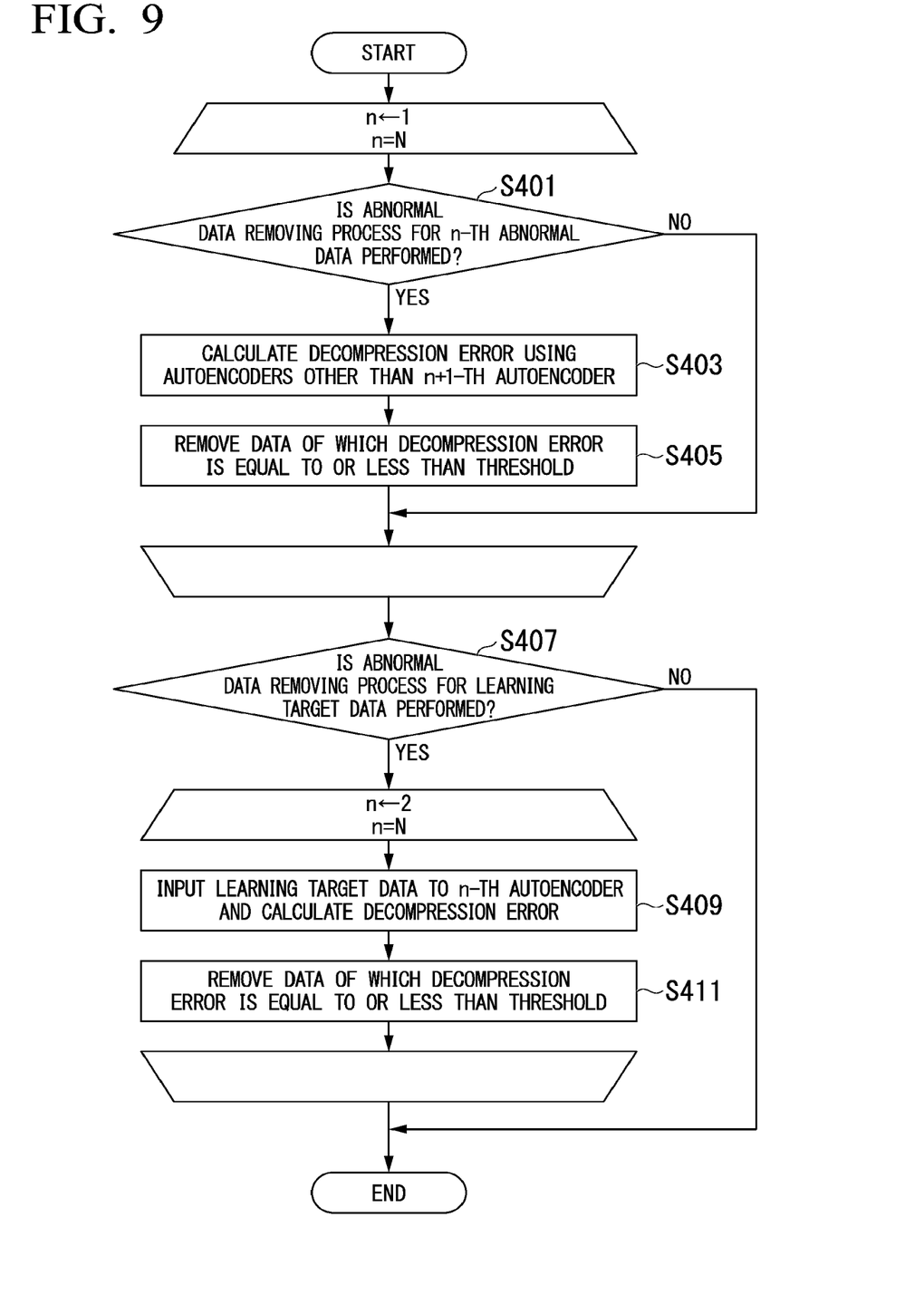
FIG. 9 is a flowchart showing an example of an abnormal data removing process by the abnormality detection device according to the second embodiment.

Next, an operation of the abnormality detection device 2 according to the embodiment will be described. A flow of an entire process of the abnormality detection device 2 is the same as that of the abnormality detection device 1 in the first embodiment shown in FIG. 2 except for an abnormal data removing process and a learning process. Hereinafter, only the abnormal data removing process and the learning process of the abnormality detection device 2 will be described. FIG. 9 is a flowchart showing an example of an abnormal data removing process by the abnormality detection device 2 according to the embodiment.

First, the controller 10 determines whether the process of removing the abnormal data included in the first abnormal data is performed (step S401). For example, when the receiver 20 receives an instruction to perform the abnormal data removing process from the user of the abnormality detection device 2, the controller 10 determines that the abnormal data removing process is performed.

When the controller 10 determines that the process of removing the abnormal data included in the first abnormal data is performed, the remover 16 calculates the decompression error using the autoencoders other than the second autoencoder 32 (the third to N-th autoencoders) (step S403). Next, the remover 16 removes data of which the calculated decompression error is equal to or less than the threshold (step S405).

That is, the remover 16 inputs the first abnormal data to the third autoencoder 34 using the third abnormal model and calculates the decompression error. Next, the remover 16 removes the data of which the calculated decompression error is equal to or less than the threshold from the first abnormal data. The data of which the decompression error is equal to or less than the threshold, that is, the data of which the decompression error is slight, is equivalent to abnormal data included in the first abnormal data.

Next, a similar abnormal data removing process is performed using the fourth autoencoder 36 on the data on which the abnormal data removing process is performed using the third autoencoder 34. Subsequently, by repeatedly removing similar abnormal data using the fifth to N-th autoencoders, it is possible to obtain data in which a ratio of abnormal data which is a learning target of the second autoencoder 32 is high. It is not necessary to perform the abnormal data removing process in the order of the third, fourth, . . . , and N-th autoencoders. The abnormal data removing process may be performed in an arbitrary order of the third to N-th autoencoders.

Thereafter (or when the controller 10 determines that the process of removing the abnormal data included in the first abnormal data is not performed), the process of removing the foregoing abnormal data is performed for the third to N-th autoencoders. After the process of removing the foregoing abnormal data, the learning process in the second to N-th autoencoders may be performed based on the abnormal data subjected to the abnormal data removing process.

Next, the controller 10 determines whether the process of removing the abnormal data included in the learning target data is performed (step S407). For example, when the receiver 20 receives an instruction to perform the abnormality data removing process from the user of the abnormality detection device 2, the controller 10 determines that the abnormality data removing process is performed.

When the controller 10 determines that the process of removing the abnormal data included in the learning target data is performed, the remover 16 inputs the learning target data to the second autoencoder 32 using the second abnormal model and calculates a decompression error (step S409). Next, the remover 16 removes data of which the calculated decompression error is equal to or less than the threshold (step S411). Next, a similar data removing process is performed using the third autoencoder 34 on data on which the data removing process was performed using the second autoencoder 32. Thereafter, by performing a similar data removing process using the fourth to N-th autoencoders, it is possible to obtain learning target data (second learning target data) in which abnormal data is slight and a ratio of the normal data which is a learning target of the first autoencoder 30 is high. The remover 16 causes the learning target data storage D3 to store the second learning target data. It is not necessary to perform the data removing process in the order of the second, third, . . . , and N-th autoencoders. The normal data removing process may be performed in an arbitrary order of the second to N-th autoencoders. Thus, the process of the flowchart ends.

Figure 10:
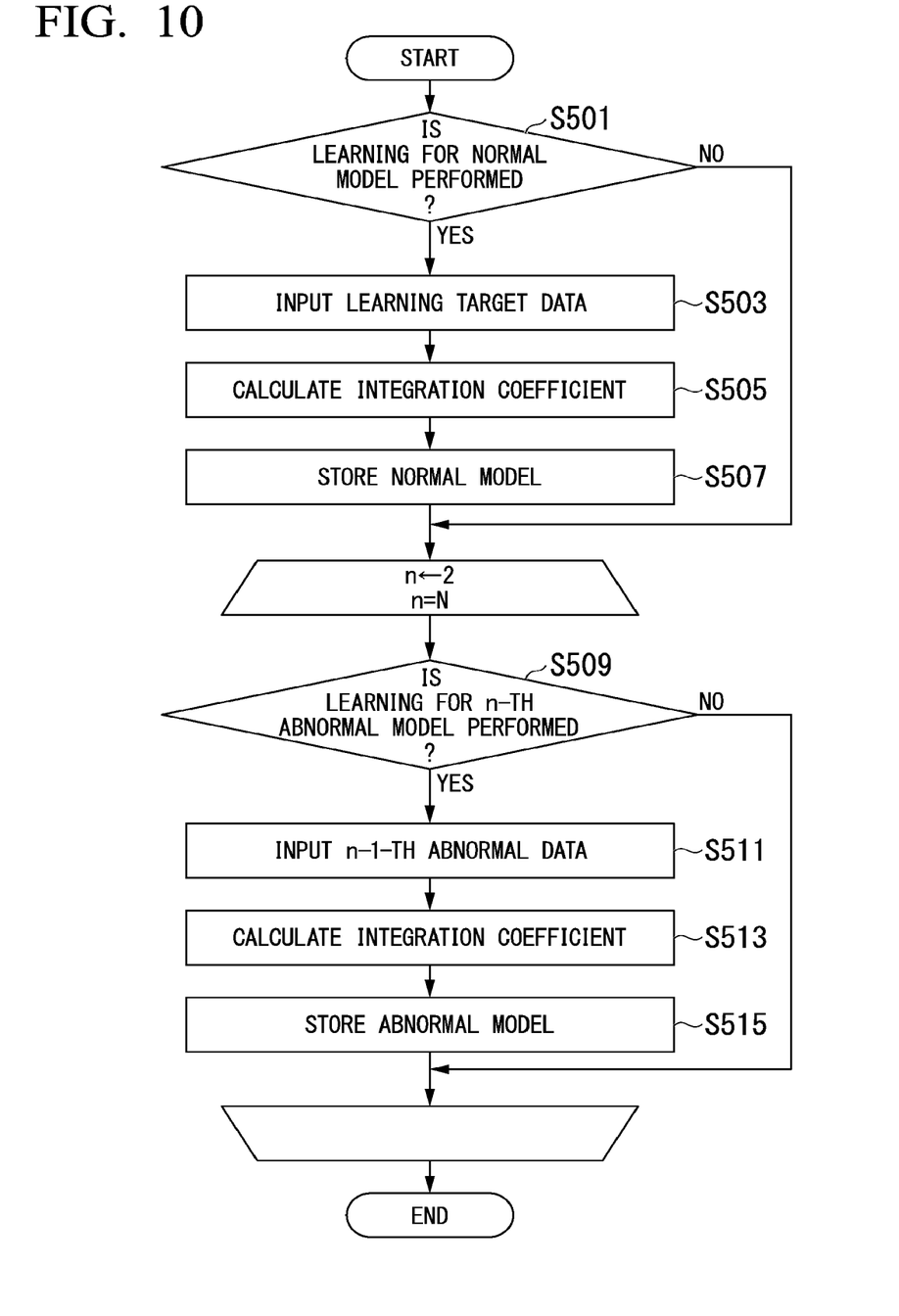
FIG. 10 is a flowchart showing an example of a learning process by the abnormality detection device according to the second embodiment.

Next, the learning process by the abnormality detection device 2 according to the embodiment will be described. FIG. 10 is a flowchart showing an example of the learning process by the abnormality detection device 2 according to the embodiment.

First, the controller 10 determines whether a normal model learning process is performed (step S501). For example, when the receiver 20 receives an instruction to perform the normal model learning process from the user of the abnormality detection device 2, the controller 10 determines that the learning process is performed.

When the controller 10 determines that the normal model learning process is performed, the learner 18 reads learning target data (for example, second learning target data subjected to the foregoing abnormal data removing process) from the learning target data storage D3 and inputs the second learning target data to the first autoencoder 30 (step S503).

Next, the learner 18 causes the first autoencoder 30 to learn the second learning target data and calculates an integration coefficient suitable for the second learning target data (step S505).

Next, the learner 18 causes the model storage D4 to store the calculated integration coefficient as a normal model (step S507).

Next, the controller 10 determines whether the learning process for the second abnormal model is performed (step S509). For example, when the receiver 20 receives an instruction to perform the learning process for the second abnormal model from the user of the abnormality detection device 2, the controller 10 determines that the learning process is performed.

When the controller 10 determines that the learning for the second abnormal model is performed, the learner 18 reads the first abnormal data from the abnormal data storage D2 and inputs the first abnormal data to the second autoencoder 32 (step S511).

Next, the learner 18 causes the second autoencoder 32 to learn the first abnormal data and calculates an integration coefficient suitable for the first abnormal data (step S513).

Next, the learner 18 causes the model storage D4 to store the calculated integration coefficient as a first abnormal model (step S515). Thereafter, a similar learning process is performed using the second to N-th autoencoders. It is not necessary to perform the learning process in the order of the second, third, . . . , and N-th autoencoders. The learning process may be performed in an arbitrary order of the second to N-th autoencoders. Thus, the process of the flowchart ends.

According to the above-described embodiments, it is possible to provide the abnormality detection device, the abnormality detection method, and the storage medium capable of performing abnormality detection with high precision. In the embodiments, by using the plurality of autoencoders suitable for the plurality of kinds of abnormal data, it is possible to improve performance for removing abnormal data.

In the embodiments, the example in which the learning for the abnormal models (the second to N-th autoencoders) is performed in the learning process after the normal model (the first autoencoder 30) is learned has been described.

However, the learning of the normal model (the first autoencoder 30) may be performed after the learning of the abnormal models.

Example

Figure 11:
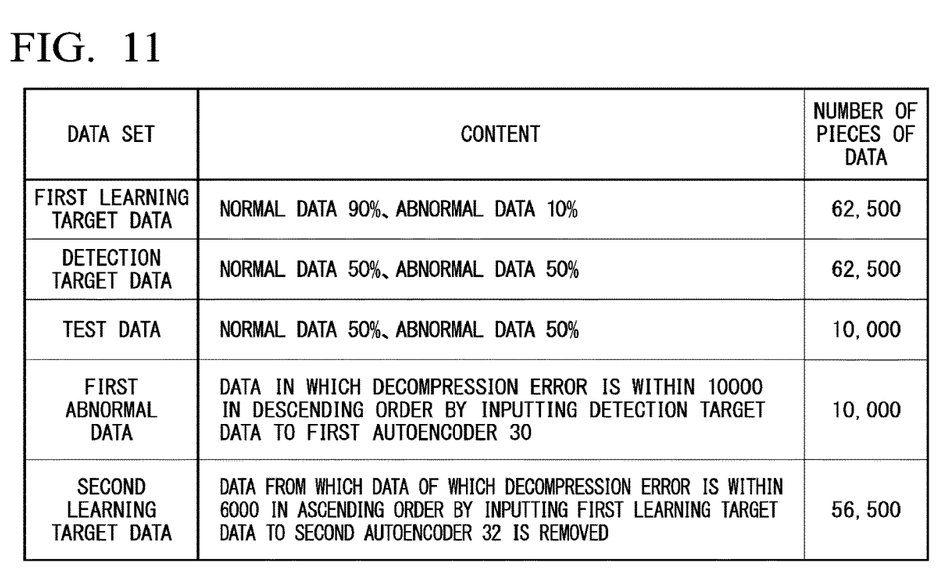
FIG. 11 is a diagram showing a data set used for an evaluation test of an example.
Figure 12:
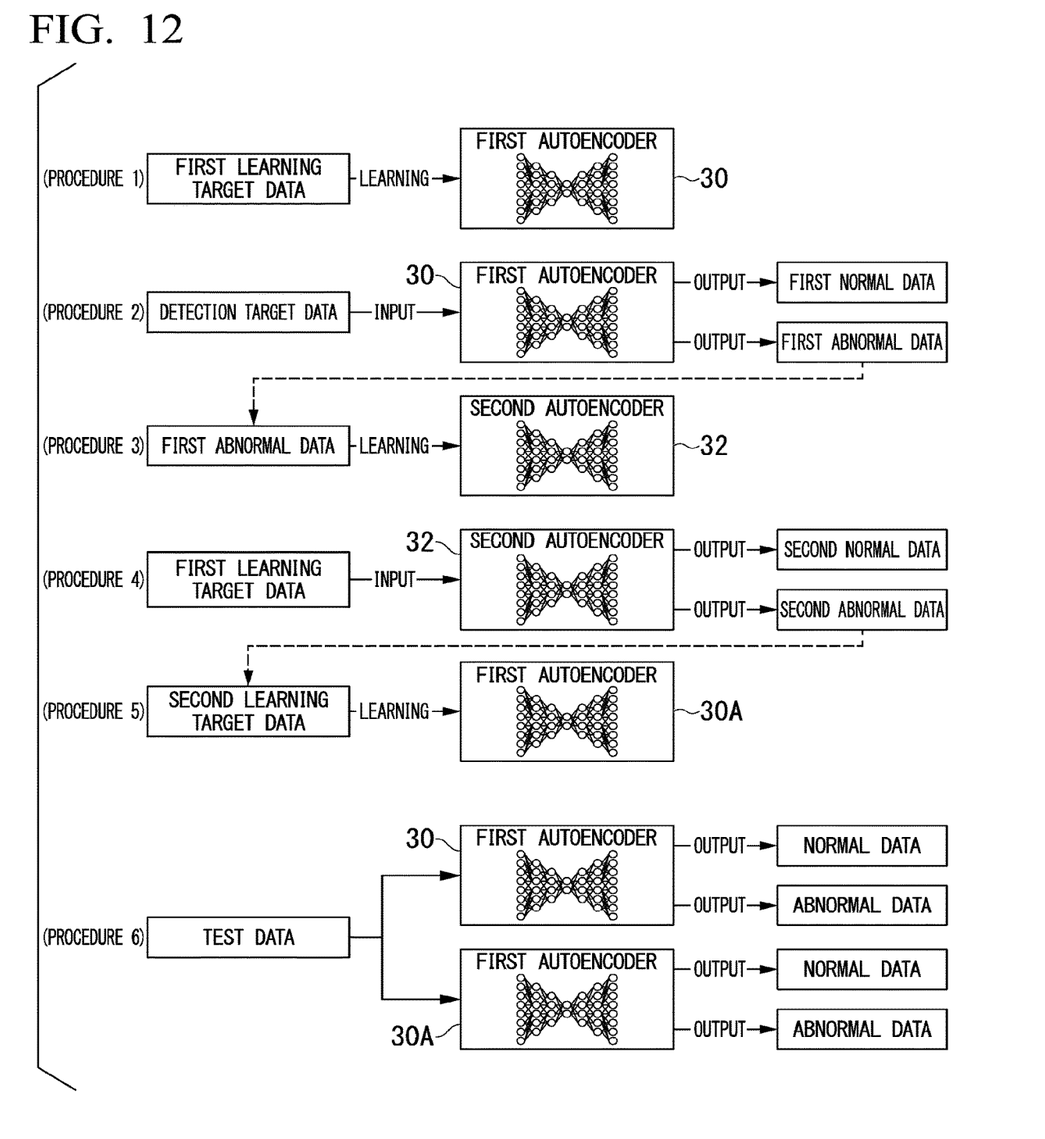
FIG. 12 is a diagram showing an evaluation procedure of the evaluation test of the example.

An evaluation test of the following procedure was performed to evaluate performance of the foregoing abnormality detection devices 1 and 2. FIG. 11 is a diagram showing a data set used for an evaluation test of the example. FIG. 12 is a diagram showing an evaluation procedure of the evaluation test of the example.

Evaluation Procedure

Procedure 1: learning the first autoencoder 30 based on the first learning target data;

Procedure 2: inputting the detection target data to the first autoencoder 30 and extracting the data in which the decompression error is up to a high-rank 10,000 as first abnormal data;

Procedure 3: learning the second autoencoder 32 based on the first abnormal data;

Procedure 4: inputting the learning target data to the second autoencoder 32, removing the data within the decompression error of a low-rank 6,000, and storing the data as second learning target data;

Procedure 5: learning of first autoencoder 30 based on the second learning target data (the first autoencoder after the learning is referred to as a first autoencoder 30A); and Procedure 6: inputting test data to each of the first autoencoder 30 and the first autoencoder 30A and evaluating detection performance of the abnormal data in an evaluation index area under the curve (AUC).

The area under the curve (AUC) is an area under a receiver operating characteristic (ROC: receiver operation characteristics) curve which is an evaluation index of a classifier, takes a value from 0 to 1, and indicates that precision of classification is higher as the value is closer to 1. A case in which the AUC is 1 indicates that targets can be completely classified.

In the procedure 6, when the test data is input to the first autoencoder 30, the AUC is 0.76. When the test data is input to the first autoencoder 30A, the AUC is 0.99. Thus, it was found that the precision of the classification is improved by performing the abnormal data removing process using the second autoencoder 32.

According to at least one of the above-described embodiments, an abnormality detection device includes: a detector configured to detect first abnormal data in detection target data which is an abnormality detection target by inputting the detection target data to a first autoencoder performing learning based on first learning target data which is a learning target; a remover configured to remove data associated with the first abnormal data from the first learning target data to generate second learning target data by inputting the first learning target data to a second autoencoder performing learning based on the first abnormal data detected by the detector; and a learner configured to cause the first autoencoder to perform learning based on the second learning target data generated by the remover. Thus, it is possible to perform the abnormality detection of the data with high precision.

While some embodiments of the invention have been described, it should be understood that these are exemplary of the invention and are not to be considered as limiting. The embodiments can be realized in various other forms and additions, omissions, substitutions, and other modifications can be made without departing from the spirit or scope of the present invention. The embodiments and the modifications are included in the present invention described in the claims and the equivalent scope as long as the embodiments and the modifications are included in the scope or the gist of the present invention.

The invention claimed is:

1. An abnormality detection device comprising:
    a detector configured to detect first abnormal data in detection target data which is an abnormality detection target by inputting the detection target data to a first autoencoder which performed learning based on first learning target data which is a learning target;
    a remover configured to remove data associated with the first abnormal data from the first learning target data to generate second learning target data by inputting the first learning target data to a second autoencoder which performed learning based on the first abnormal data detected by the detector; and
    a learner configured to cause the first autoencoder to perform learning based on the second learning target data generated by the remover.

2. The abnormality detection device according to claim 1, wherein
    the detector is configured to calculate a first difference between the detection target data and decompressed data generated by compressing and decompressing the detection target data by the first autoencoder and to detect the first abnormal data based on the first difference.

3. The abnormality detection device according to claim 1, wherein
    the remover is configured to calculate a second difference between the first learning target data and decompressed data generated by compressing and decompressing the first learning target data by the second autoencoder and to remove data associated with the first abnormal data from the first learning target data to generate the second learning target data based on the second difference.

4. The abnormality detection device according to claim 1, wherein
    the remover is configured to remove the second abnormal data from the second learning target data to generate third learning target data by inputting the second learning target data to a third autoencoder which performed learning based on second abnormal data, and the second abnormal data is data in which a difference between the first abnormal data and decompressed data generated by compressing and decompressing the first abnormal data by the second autoencoder is equal to or greater than a threshold in the first abnormal data, and
    the learner is configured to cause the first autoencoder to perform learning based on the third learning target data.

5. The abnormality detection device according to claim 1, wherein
    the remover is configured to remove n-th abnormal data from n-th learning target data to generate n+1-th learning target data by inputting the n-th learning target data to an n+1-th autoencoder which performed learning based on the n-th abnormal data, and the n-th abnormal data is data in which a difference between n−1-th abnormal data and decompressed data generated by compressing and decompressing the n−1-th abnormal data by an n-th autoencoder is equal to or greater than a threshold in the n−1-th abnormal data,
    the learner is configured to cause the first autoencoder to perform learning based on the n+1-th learning target data, and
    n is a natural number equal to or greater than 2.

6. An abnormality detection method comprising:
  detecting first abnormal data in detection target data which is an abnormality detection target by inputting the detection target data to a first autoencoder which performed learning based on first learning target data which is a learning target;
  removing data associated with the first abnormal data from the first learning target data to generate second learning target data by inputting the first learning target data to a second autoencoder which performed learning based on the detected first abnormal data; and
  causing the first autoencoder to perform learning based on the generated second learning target data.

7. The abnormality detection method according to claim 6, comprising:
  removing the second abnormal data from the second learning target data to generate third learning target data by inputting the second learning target data to a third autoencoder which performed learning based on second abnormal data, and the second abnormal data being data in which a difference between the first abnormal data and decompressed data generated by compressing and decompressing the first abnormal data by the second autoencoder is equal to or greater than a threshold in the first abnormal data; and
  causing the first autoencoder to perform learning based on the third learning target data.

8. A non-transitory computer-readable storage medium storing an abnormality detection program causing a computer to perform:
  detecting first abnormal data in detection target data which is an abnormality detection target by inputting the detection target data to a first autoencoder which performed learning based on first learning target data which is a learning target;
  removing data associated with the first abnormal data from the first learning target data to generate second learning target data by inputting the first learning target data to a second autoencoder which performed learning based on the detected first abnormal data; and
  causing the first autoencoder to perform learning based on the generated second learning target data.

9. The non-transitory computer-readable storage medium according to claim 8, wherein the abnormality detection program causes the computer to perform:
  removing the second abnormal data from the second learning target data to generate third learning target data by inputting the second learning target data to a third autoencoder which performed learning based on second abnormal data, and the second abnormal data being data in which a difference between the first abnormal data and decompressed data generated by compressing and decompressing the first abnormal data by the second autoencoder is equal to or greater than a threshold in the first abnormal data; and
  causing the first autoencoder to perform learning based on the third learning target data.

* * * * *